United States Patent
Clerc et al.

(10) Patent No.: US 8,570,060 B2
(45) Date of Patent: Oct. 29, 2013

(54) METHOD FOR PROTECTING A LOGIC CIRCUIT AGAINST EXTERNAL RADIATION AND ASSOCIATED ELECTRONIC DEVICE

(75) Inventors: Sylvain Clerc, Grenoble (FR); Fabian Firmin, Saint Martin d'Hères (FR); Philippe Roche, Biviers (FR)

(73) Assignee: STMicroelectronics SA, Montrouge (FR)

( * ) Notice: Subject to any disclaimer, the term of this patent is extended or adjusted under 35 U.S.C. 154(b) by 18 days.

(21) Appl. No.: 13/111,756

(22) Filed: May 19, 2011

(65) Prior Publication Data

US 2011/0291696 A1    Dec. 1, 2011

(30) Foreign Application Priority Data

May 25, 2010    (FR) ...................... 10 54032

(51) Int. Cl.
*H03K 19/003*    (2006.01)
(52) U.S. Cl.
USPC ............................................................ 326/11
(58) Field of Classification Search
USPC ...................................................... 326/8–15
See application file for complete search history.

(56) References Cited

U.S. PATENT DOCUMENTS

| | | | |
|---|---|---|---|
| 4,091,293 A | 5/1978 | Ando | |
| 5,570,313 A | 10/1996 | Masson et al. | |
| 5,732,027 A * | 3/1998 | Arcoleo et al. | 365/189.05 |
| 5,958,026 A * | 9/1999 | Goetting et al. | 710/52 |
| 6,147,513 A * | 11/2000 | Bui | 326/83 |
| 6,320,409 B1 | 11/2001 | Nakajima et al. | |
| 6,433,983 B1 * | 8/2002 | Fechner | 361/111 |
| 6,489,837 B2 * | 12/2002 | Schultz et al. | 327/541 |
| 6,667,520 B1 | 12/2003 | Fulkerson | |
| 6,703,858 B2 | 3/2004 | Knowles | |
| 6,937,053 B2 * | 8/2005 | Carlson et al. | 326/14 |
| 7,149,267 B2 * | 12/2006 | Terada et al. | 375/358 |
| 7,973,557 B2 * | 7/2011 | Bittlestone et al. | 326/38 |
| 8,072,242 B2 * | 12/2011 | Barbier | 326/86 |
| 2004/0257108 A1 * | 12/2004 | Carlson et al. | 326/14 |
| 2008/0068044 A1 * | 3/2008 | Mo | 327/12 |
| 2008/0072200 A1 * | 3/2008 | Mo | 716/7 |
| 2008/0290903 A1 * | 11/2008 | Mo | 327/5 |

OTHER PUBLICATIONS

République Française Institut National De La Propriété Industrielle, Rapport De Recherche Préliminaire (Preliminary Search Report); issued in French Patent Application No. FR 1054032 on Feb. 17, 2011 (2 pages).

* cited by examiner

Primary Examiner — Thienvu Tran
(74) Attorney, Agent, or Firm — Slater & Matsil, L.L.P.

(57) ABSTRACT

A method for protecting an electronic circuit having at least one output against external radiation includes functionally duplicating the electronic circuit and linking the outputs of the electronic circuit and the duplicated electronic circuit to homologous inputs of at least functionally equivalent combinatorial or sequential elements. The homologous outputs of all the combinatorial or sequential elements are linked together. The electronic circuit can be duplicated multiple times.

16 Claims, 3 Drawing Sheets

METHOD FOR PROTECTING A LOGIC CIRCUIT AGAINST EXTERNAL RADIATION AND ASSOCIATED ELECTRONIC DEVICE

This application claims the priority benefit of French patent application No. FR 10/54032, filed on May 25, 2010, entitled "Method for Protecting a Logic Circuit Against External Radiations and Associated Electronic Device" which application is hereby incorporated herein by reference to the maximum extent allowable by law.

TECHNICAL FIELD

The invention relates to the robustness of electronic components such as integrated circuits, and more particularly to the robustness of integrated circuits in a radiative environment.

BACKGROUND

The impact of a particle on a transistor or close to a transistor may generate a stray current in an integrated circuit, depending on the ionizing power of this particle (for example characterized by its LET: Linear Energy Transfer). Indeed, the quantity of charge generated by a particle corresponds to that implemented during a change of state of a logic node controlled by a transistor. The consequence of this impact may be a change of state, or of levels, of the logic signals, and consequently give rise to errors at the output of the circuit.

In order to mitigate the errors generated by such phenomena, it is customary to duplicate the signals by duplicating the circuits which generate such signals. Such a redundancy makes it possible to reduce the probability of obtaining an erroneous signal at the output. Indeed, the probability of all the duplicated signals deriving from one and the same signal all being modified at one and the same time, that is to say of all the circuits generating these signals simultaneously undergoing a radiative disturbance, is much lower than the probability of an unduplicated signal being disturbed by external radiation. In this way, an analysis of the duplicated signals at the output makes it possible to retrieve the undisturbed value in a more reliable manner.

Certain business sectors, such as aerospace or the medical sector, need component robustness allowing close to 100% reliability of response, this characteristic outweighing the other factors.

It is known, in particular through the documents U.S. Pat. No. 6,703,858 or U.S. Pat. No. 5,570,313, to use electrical components named "C elements" to resolve these disturbances. As illustrated in FIG. 1, these C elements comprise, for example, a stack of four transistors, two PMOS transistors 11 and 12, and two NMOS transistors 13 and 14, coupled in series. The output signal of a logic block $A_0$ is coupled at the input of the first PMOS transistor 11 and of the second NMOS transistor 14, and a second output signal of the logic block $A_1$, corresponding to a duplication of the first signal $A_0$, is coupled at the input of the second PMOS transistor 12 and of the first NMOS transistor 13. The output S is taken between the second PMOS transistor 12 and the first NMOS transistor 13.

These C elements are very good filters against errors induced by radiation. Indeed, if a disturbance occurs on just one of the two blocks, the two signals will be of contrary values, thus disabling any output signal. Indeed, if the signals deriving from the blocks $A_0$ and $A_1$ are different, no output signal will be emitted. However, these C elements have a weak output current and therefore a long response time for a given surface area. Other business sectors do not need such reliability, but on the other hand require more optimal criteria regarding speed of response, surface occupancy and power.

SUMMARY OF THE INVENTION

According to one embodiment and one mode of implementation, there is proposed a protection architecture aimed at improving the characteristics of response speed and power while preserving one and the same occupancy area.

According to one aspect, there is proposed a method for protecting an electronic circuit, for example a logic block, against external radiation, the said electronic circuit comprising at least one output.

According to a general characteristic of this aspect, at least one duplication of the electronic circuit is performed, the duplication being an at least functional duplication of the electronic circuit, and the outputs of the electronic circuits can be linked respectively to homologous inputs of at least functionally identical combinatorial or sequential elements, and the homologous outputs of all the combinatorial or sequential elements are linked together.

According to another aspect, there is proposed an electronic device allowing protection of an electronic circuit against external radiation.

According to a general characteristic, the electronic device comprises N at least functionally identical electronic circuits each comprising at least one output and N at least functionally identical combinatorial or sequential elements having at least one input, with N>1, the outputs of the electronic circuits being respectively linked to homologous inputs of the combinatorial or sequential elements, and the homologous outputs of the combinatorial or sequential elements being respectively linked together.

BRIEF DESCRIPTION OF THE DRAWINGS

Other advantages and characteristics of the invention will be apparent on examining the detailed description of wholly non-limiting embodiments and the appended drawings in which.

DETAILED DESCRIPTION OF ILLUSTRATIVE EMBODIMENTS

Figure 1:
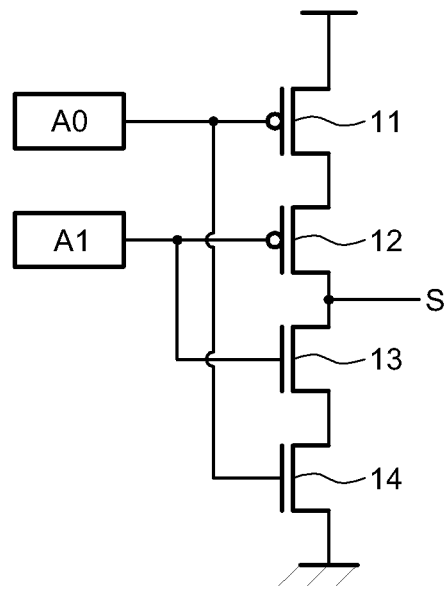
FIG. 1 already cited, represents a protection device according to the prior art.

Before addressing the illustrated embodiments in detail, the various advantageous features and embodiments of the invention are discussed generally in the following paragraphs.

The protection principle offered here is totally different from that of the prior art. Indeed, the fact that the homologous outputs of the combinatorial or sequential elements are linked together will lead in the case of a disturbance on one of the duplicated circuits to a temporary short-circuit at the output (instead of an absence of emission of a signal at the output in the prior art).

Moreover, as explained hereinafter, a functional duplication makes it possible to solve the problem of response speed, even if a structural duplication, leading to structurally identical circuits, such as for example structurally identical logic blocks, is preferable in terms of consumption.

Likewise, it is not necessary for the combinatorial or sequential elements to be structurally identical, as long as they are at least functionally identical. Advantageously, additional electronic circuits can be linked respectively to additional inputs of the combinatorial elements.

Thus, for example, if the combinatorial elements comprise two inputs, it is possible to protect distinct first and second circuits by duplicating each of them. The first circuit and its duplicates will be, for example, coupled to the first inputs of the combinatorial elements, and the second circuit and its duplicates will be, for example, coupled to the second inputs of the combinatorial elements. The combination of the output signals of the two circuits will then be delivered at the output of the combinatorial elements.

Preferably, the duplicated electronic circuits are structurally identical. Indeed, in the case where they are not structurally identical but functionally identical, there may possibly be a time delay between the signals of outputs which will increase the energy consumption, consequently decreasing the performance of the electronic device. But, the electronic device operates all the same with functionally identical electronic circuits.

The combinatorial or sequential elements can comprise one or more outputs. Thus, for example, in the case of a combinatorial element formed, for example, of a full adder, comprising a first output for the sum and a second output for the carry, there is provision, on the one hand, to couple together the first outputs of the full adders used, and, on the other hand, to couple together the second outputs of the full adders. Preferably, the number N of combinatorial or sequential elements and of electronic circuits is at least equal to two.

By multiplying the duplicates of electronic circuits and, correspondingly, the combinatorial or sequential elements, the current strength ratio is modified. Indeed, multiplication of the circuits and elements makes it possible to dilute the impact of the error due to the radiative disturbance. In a case where the electronic circuit and the combinatorial element are triplicated, for example, if the radiative disturbance is contained on just one of the electronic circuits, then just one signal will be erroneous, and two signals will be correct. The short-circuit which will then be generated will wane faster than in a case of a duplication, and the amplitude of the disturbance will be less significant. By thus modifying the current strength ratio by virtue of the multiplication of the electronic circuits, and of the corresponding combinatorial elements, the protection characteristics of the electronic device are further improved.

Advantageously, the device can comprise at most N at least functionally identical additional electronic circuits. The combinatorial or sequential elements can comprise an additional input, and the outputs of the additional electronic circuits can respectively be linked to additional inputs of the combinatorial elements. The combinatorial elements can comprise CMOS inverters.

The PMOS and NMOS transistors of a combinatorial or sequential element can preferably have channels exhibiting substantially identical dimensional characteristics. This presents the advantage of balancing the delays between the duplicated elements and of minimizing the time during which the elements in parallel with one and the same output give rise to a transient short-circuit.

The combinatorial elements can also comprise CMOS logic gates such as NAND gates. It is also possible to use sequential elements such as flip-flops, or "latches", instead, and combinatorial elements.

In the detailed description which follows, the electronic circuits to be protected are logic blocks. That said, the invention is not limited to this type of electronic circuit but applies to any type of electronic circuit delivering as output one or more signals that it is desirable to protect against external radiation, such as for example a sensor.

Figure 2:
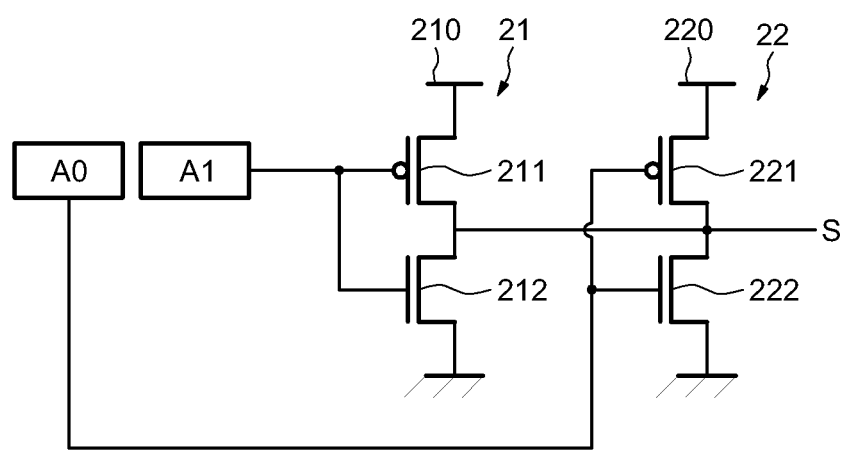
FIG. 2 represents an electronic device according to a first embodiment.

FIG. 2 schematically illustrates an electronic device according to a first embodiment of the invention. In this first embodiment, the electronic device comprises a logic block $A_0$ and a logic block $A1$ that it is sought to be protected from a radiative environment, logic block $A1$ being a duplication of logic block $A_0$. The electronic device also comprises two identical combinatorial elements 21 and 22, such as an inverter.

The first inverter 21 comprises a PMOS transistor 211 coupled in series with an NMOS transistor 212 between a power supply terminal 210 and ground. Likewise, the second inverter 22 comprises a PMOS transistor 221 coupled in series with an NMOS transistor 222 between a power supply terminal 220 and ground.

The logic blocks $A_0$ and $A_1$ are respectively coupled at the respective input of the two inverters. The outputs of the inverters are coupled together and constitute the output S of the electronic device.

When the signals deriving from the logic blocks $A_0$ and $A_1$ differ at the input of the combinatorial elements 21 and 22, for example because of a disturbance of one of the blocks, $A_0$, $A_1$, by an external radiation, the output S will be short-circuited, delivering an indeterminate voltage.

However, in comparison with a "C element", an electronic device according to this first embodiment of the invention makes it possible to divide by four the output current and therefore the response time of the circuit, for a given surface area, while offering protection against external radiation. Indeed, the short-circuit produced during a disturbance of one of the logic blocks lasts only a very short time, of the order of a nanosecond, the duration of dispersion of the stray charges produced by the ionizing particle in one of the two logic blocks $A_0$ or $A_1$. If no disturbance occurs again (low probability), the electronic device again delivers as output the desired value of the signal.

Figure 3:
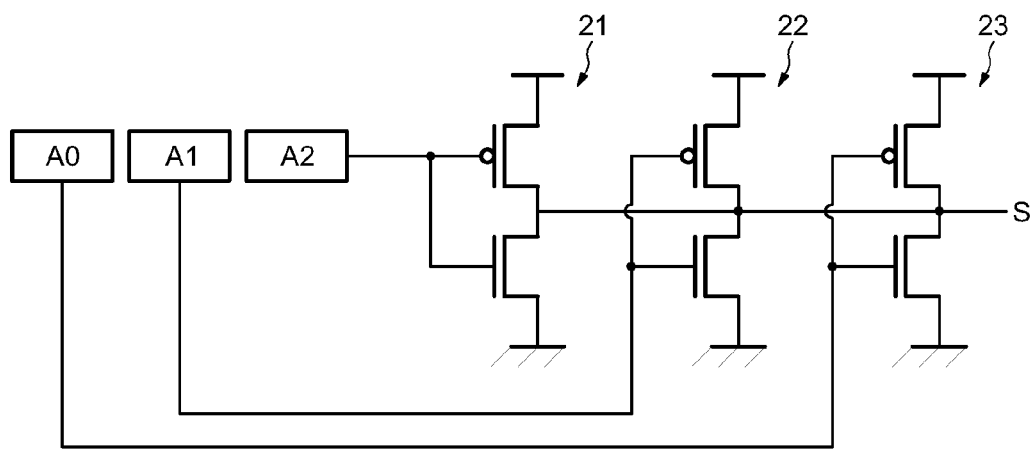
FIG. 3 represents an electronic device according to a second embodiment.

FIG. 3 schematically illustrates an electronic device according to a second embodiment of the invention. This second embodiment differs from the first embodiment illustrated in FIG. 2 in that the logic block to be protected has been triplicated so as to have a first logic block $A_0$, a second logic block $A_1$, and a third logic block $A_2$, and in that it comprises three inverters 21, 22 and 23 each comprising a PMOS transistor coupled in series with an NMOS transistor between a potential and ground. The three blocks $A_0$, $A_1$ and $A_2$ are respectively each coupled to the respective input of an inverter 23, 22 and 21. Such a device makes it possible to increase the protection of a logic block by modifying the current strength ratio.

Indeed, the multiplication of the logic blocks and inverters allows all the more dilution of the impact of the error due to the radiative disturbance. In the example illustrated in this FIG. 3, if the radiative disturbance is contained on just one of the triplicated logic blocks, for example the logic block $A_0$, there will be just one erroneous signal for two correct signals, which will be delivered to the assembly composed of the inverters. The resulting short-circuit at the output S of the inverters will be of lesser amplitude than in a case of simple duplication as for example in FIG. 2. By thus modifying the current strength ratio by virtue of the multiplication of the logic blocks, and of the corresponding combinatorial elements, the protection characteristics of the electronic device are further improved.

Figure 4:
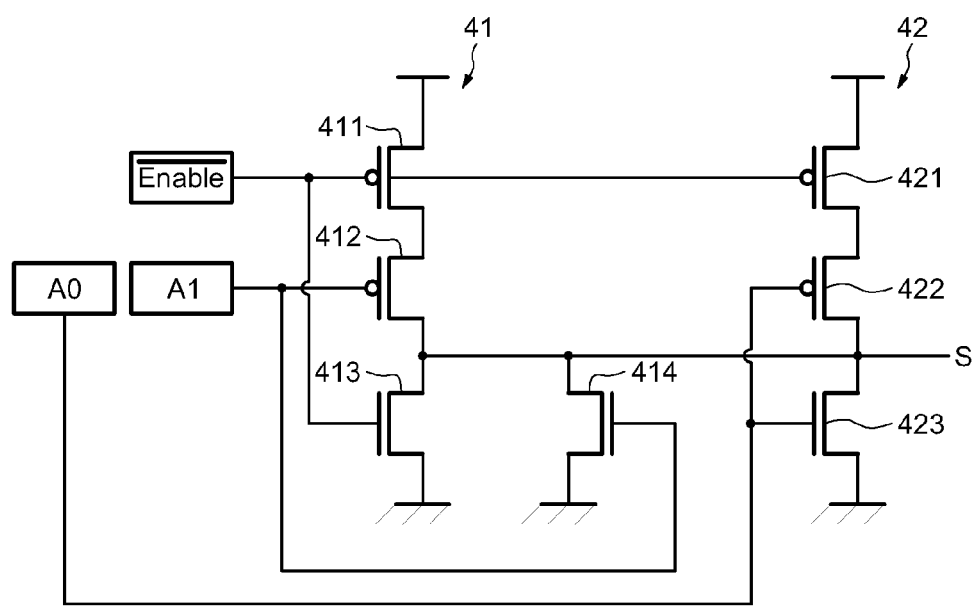
FIG. 4 represents an electronic device according to a third embodiment.

FIG. 4 schematically presents a third embodiment of an electronic device according to the invention. In this third embodiment, the electronic device comprises a logic block $A_0$ that it is sought to be protected from a radiative environment. The logic block $A_0$ is duplicated as a duplicated logic block $A_1$.

The electronic device of FIG. 4 also comprises a first combinatorial element 41 consisting of a NOR logic gate comprising a first PMOS transistor 411 coupled in series with a second PMOS transistor 412 itself coupled in series with a first NMOS transistor 413 coupled to ground, the first NMOS transistor 413 being coupled in parallel with a second NMOS transistor 414.

The electronic device comprises a second combinatorial element 42 operating as a NOR logic gate. The second combinatorial element 42 comprises a first PMOS transistor 421 coupled in series with a second PMOS transistor 422 itself coupled in series with an NMOS transistor 423 coupled to ground, the NMOS transistor 423 being coupled in parallel with the second NMOS transistor 414 of the first combinatorial element 41. This assembly of transistors allows the second combinatorial element to operate as a NOR logic gate. Consequently, here the combinatorial element 42 is not structurally identical to the combinatorial element 41 but only functionally identical.

The duplicated logic block $A_1$ is coupled to a first input of the first combinatorial element 41, this first input being coupled to the gate of the second PMOS transistor 412 and to the gate of the second NMOS transistor 414 of this first combinatorial element 41. The logic block $A_0$ is coupled to a first input of the second combinatorial element 42, this first input being coupled to the gate of the second PMOS transistor 422 and to the gate of the first NMOS transistor 423 of this second combinatorial element 42.

A distinct signal $\overline{\text{Enable}}$ of the first logic block $A_0$ is coupled to a second input of the first combinatorial element 41, this second input being coupled to the gate of the first PMOS transistor 411 and to the gate of the first NMOS transistor 413, as well as to a second input of the second combinatorial element 42, this second input being coupled to the gate of the first PMOS transistor 421 of the second combinatorial element 42. This signal $\overline{\text{Enable}}$ thus coupled to the second inputs of the combinatorial elements 41 and 42 makes it possible to activate the combinatorial elements or to disable them, so blocking the operation of the electronic device. Finally, the outputs of the combinatorial elements are coupled together forming a common output S.

Figure 5:
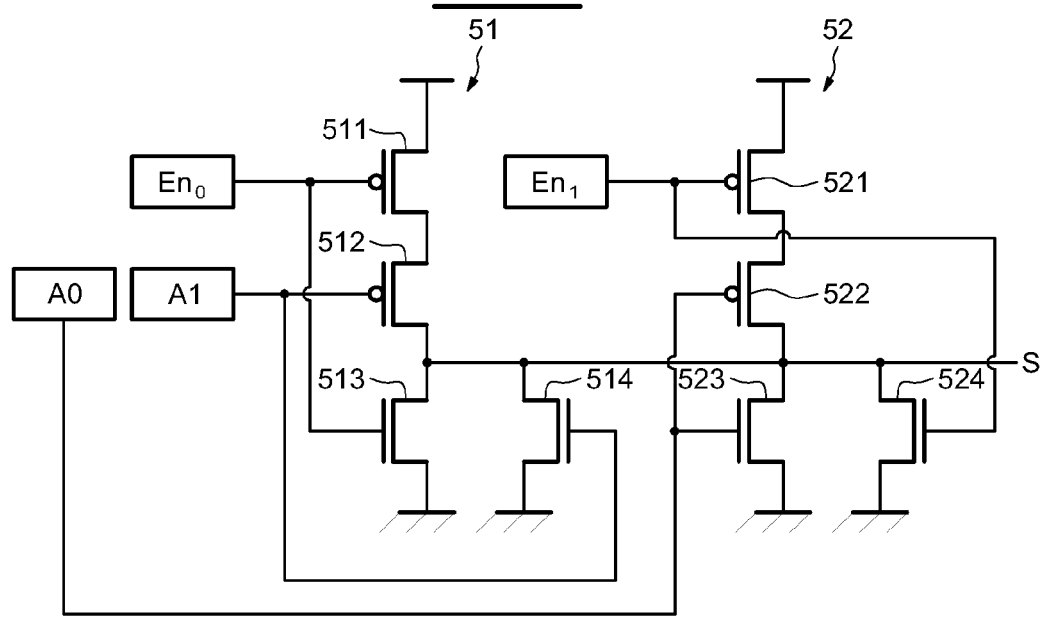
FIG. 5 represents an electronic device according to a fourth embodiment.

FIG. 5 represents a fourth embodiment of an electronic device according to the invention. In this fourth embodiment, the electronic device comprises, as previously in FIG. 4, a logic block $A_0$ that it is sought to be protected from external radiation and that has been duplicated as a duplicated logic block $A_1$. It also comprises an additional signal $En_0$ that it is also sought to be protected from external radiation and that has been duplicated as a duplicated additional signal $En_1$. This additional signal can, for example, correspond to an Enable activation circuit of the electronic device for which protection has been provided against external radiation.

The electronic device also comprises two identical combinatorial elements 51 and 52 which each consist of a NOR logic gate. This embodiment makes it possible to protect two logic blocks whose logic signals are combined ultimately.

The first combinatorial element 51 comprises a first PMOS transistor 511 coupled in series with a second PMOS transistor 512 coupled in series with a first NMOS transistor 513 coupled to ground, the first NMOS transistor 513 being coupled in parallel with a second NMOS transistor 514. The second combinatorial element 52 is constructed in an identical manner with a first and a second PMOS transistors 521 and 522 and a first and a second NMOS transistors 523 and 524.

The duplicated logic block $A_1$ is coupled to a first input of the first combinatorial element 51, this first input being coupled to the gate of the second PMOS transistor 512 and to the gate of the second NMOS transistor 514 of this first combinatorial element 51. The logic block $A_0$ is coupled to a first input of the second combinatorial element 52, this first input being coupled to the gate of the second PMOS transistor 522 and to the gate of the first NMOS transistor 523 of this second combinatorial element 52.

The additional signal $En_0$ is coupled to a second input of the first combinatorial element 51, this second input being coupled to the gate of the first PMOS transistor 511 and to the gate of the first NMOS transistor 513. The duplicated additional signal $En_1$ is coupled to a second input of the second combinatorial element 52, this second input being coupled to the gate of the first PMOS transistor 521 of the second combinatorial element and to the gate of the second NMOS transistor 524 of the second combinatorial element 52. Finally, the outputs of the two combinatorial elements 51 and 52 are coupled together forming a common output S.

Figure 6:
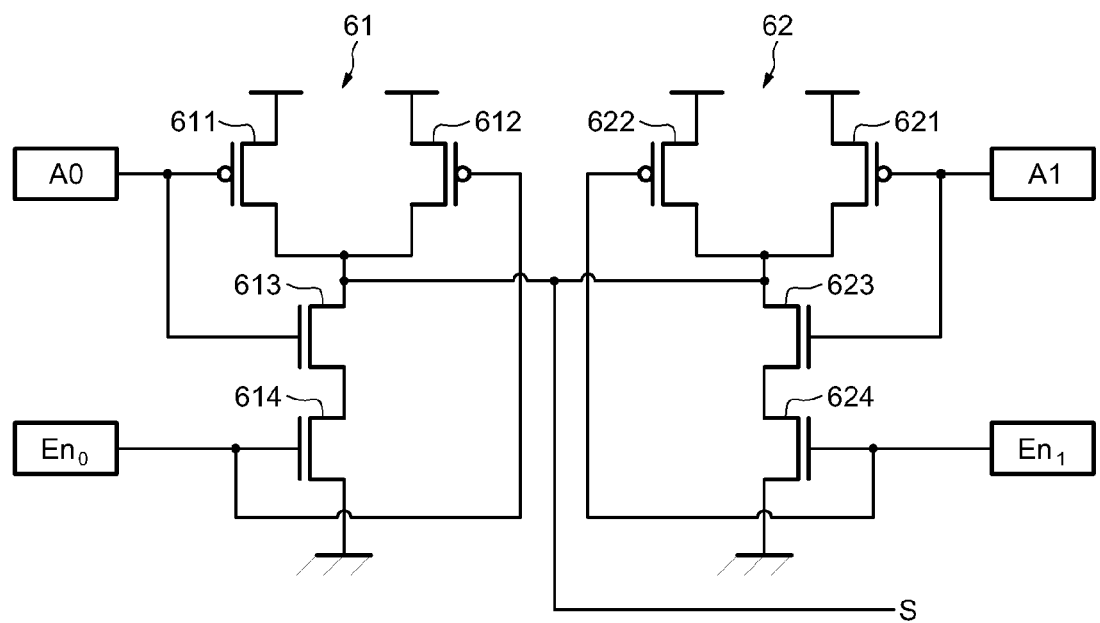
FIG. 6 represents an electronic device according to a fifth embodiment.

FIG. 6 illustrates an electronic device according to a fifth embodiment of the invention. As in the previous embodiment illustrated in FIG. 5, there is provided a logic block $A_0$ and a signal $En_0$ both duplicated as a duplicated logic block $A_1$ and a duplicated additional signal $En_1$.

In this fifth embodiment, this time the two combinatorial elements 61 and 62 are NAND logic gates (instead of the NOR logic gates) each comprising two inputs and an output. The first combinatorial element 61 comprises a first PMOS transistor 611 coupled in parallel with a second PMOS transistor 612, this parallel arrangement being coupled in series with a first NMOS transistor 613 and a second NMOS transistor 614. In the same manner, the second combinatorial element 62 comprises two PMOS transistors 621 and 622 and two NMOS transistors 623 and 624.

The logic block $A_0$ is coupled to a first input of the first combinatorial element 61, this first input being coupled to the gate of the first PMOS transistor 611 and to the gate of the first NMOS transistor 613 of this first combinatorial element 61. The duplicated logic block $A_1$ is coupled to a first input of the second combinatorial element 62, this first input being coupled to the gate of the first PMOS transistor 621 and to the gate of the first NMOS transistor 623 of this second combinatorial element 62.

The additional signal $En_0$ is coupled to a second input of the first combinatorial element 61, this second input being coupled to the gate of the first second PMOS 612 and to the gate of the second NMOS transistor 614. The duplicated additional signal $En_1$ is coupled to a second input of the second combinatorial element 62, this second input being coupled to the gate of the second PMOS transistor 622 and to the gate of the second NMOS transistor 624 of the second combinatorial element 62. Finally, the outputs of the two combinatorial elements 61 and 62 are coupled together forming a common output S.

In the various embodiments, it is perfectly possible to duplicate the logic blocks more than once so as to increase the protection of the logic block. In this case there must also be a more significant number of combinatorial elements allowing protection, this number having to correspond to the number of identical circuits for a given logic block.

What is claimed is:

1. A method for protecting an electronic circuit against external radiation, the electronic circuit having a first single output, comprising:
    duplicating the electronic circuit, wherein the duplicated electronic circuit has a second single output;
    configuring the electronic circuit and the duplicated electronic circuit so that the second single output duplicates the first single output at all times;
    linking the first single output to first and second inputs of a first combinatorial or sequential element;
    linking the second single output to homologous first and second inputs of a second combinatorial or sequential element, wherein the second combinatorial or sequential element is at least functionally identical to the first combinatorial or sequential element; and
    linking together respective homologous outputs of the combinatorial or sequential elements.

2. The method according to claim 1, in which the first and second combinatorial or sequential elements are combinatorial elements and further wherein additional electronic circuits are linked respectively to respective additional inputs of the combinatorial elements.

3. The method according to claim 1, wherein duplicating the electronic circuit comprises functionally duplicating the electronic circuit.

4. The method according to claim 3, wherein duplicating the electronic circuit comprises functionally and structurally duplicating the electronic circuit.

5. The method according to claim 1, wherein duplicating the electronic circuit comprises duplicating the electronic circuit at least twice.

6. The method according to claim 1, wherein the first and second combinatorial or sequential elements are selected from the group consisting of an inverter and a logic gate and combinations thereof.

7. The method according to claim 6, wherein the logic gate is selected from the group consisting of a NOR gate and a NAND gate.

8. The method according to claim 1, wherein the combinatorial or sequential elements are selected from the group consisting of inverters, flip-flops, and latches.

9. An electronic device, comprising:
    N functionally identical electronic circuits, each having a single output, wherein N>1, and wherein the outputs of the N functionally identical electronic circuits are configured to be identical at all times;
    N functionally identical combinatorial or sequential elements, each having at least two inputs and one output;
    each of the single outputs of the electronic circuits being respectively linked to homologous first and second inputs of the combinatorial or sequential elements; and
    the homologous outputs of the combinatorial or sequential elements being respectively linked together.

10. The electronic device according to claim 9, in which N is at least equal to three.

11. The electronic device according to claim 9, in which the combinatorial or sequential elements comprise PMOS and NMOS transistors whose respective channels exhibit substantially identical dimensional characteristics.

12. The electronic device according to claim 9, further comprising:
    N functionally identical additional electronic circuits, and wherein:
        the combinatorial or sequential elements each comprises a respective additional input; and further wherein
        respective outputs of the additional electronic circuits are respectively linked to respective homologous additional inputs of the combinatorial or sequential elements.

13. The electronic device according to claim 9, in which the combinatorial elements comprise CMOS logic gates.

14. The electronic device according to claim 13, in which the combinatorial elements comprise CMOS inverters.

15. The electronic device according to claim 13, wherein the N functionally identical electronic circuits are structurally identical.

16. The electronic device according to claim 15, wherein the N functionally identical combinatorial or sequential elements are structurally identical.

* * * * *